United States Patent
Wu et al.

(10) Patent No.: US 6,753,244 B2
(45) Date of Patent: Jun. 22, 2004

(54) METHOD FOR MANUFACTURING A COPPER FUSE STRUCTURE

(75) Inventors: Der-Yuan Wu, Hsin-Chu (TW); Chiu-Te Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/426,787

(22) Filed: May 1, 2003

(65) Prior Publication Data

US 2004/0014260 A1 Jan. 22, 2004

Related U.S. Application Data

(62) Division of application No. 10/197,861, filed on Jul. 19, 2002, now Pat. No. 6,667,534.

(51) Int. Cl.[7] .............................................. H01L 21/44
(52) U.S. Cl. ....................... 438/601; 438/132; 438/467; 438/215; 438/281
(58) Field of Search ................................ 438/600, 601, 438/710, 132, 636, 648, 467, 215, 281

(56) References Cited

U.S. PATENT DOCUMENTS

| | | | | |
|---|---|---|---|---|
| 5,970,346 A | * | 10/1999 | Liaw ............................ | 438/281 |
| 6,008,075 A | * | 12/1999 | Lien et al. .................... | 438/132 |
| 6,175,145 B1 | * | 1/2001 | Lee et al. ..................... | 257/529 |
| 6,294,474 B1 | * | 9/2001 | Tzeng et al. ................. | 438/710 |
| 6,444,544 B1 | * | 9/2002 | Hu et al. ...................... | 438/467 |
| 2002/0142592 A1 | * | 10/2002 | Barth et al. .................. | 438/687 |

* cited by examiner

Primary Examiner—Amir Zarabian
Assistant Examiner—Khanh Duong

(57) ABSTRACT

A copper fuse structure and the method for fabricating the same is disclosed in this present invention. By employing an inner copper metal layer as a fuse, the copper fuse according to this invention can be easily zipped with a laser repair tool. Furthermore, the openings on a bonding pad and the fuse of the semiconductor structure can be identified with the method according to this invention. Moreover, in contrast of the fuse formed with an upper aluminum layer in the prior art, the cost of the fuse manufacturing is lower in the method according to this invention by fabricating the fuse with an inner copper layer.

8 Claims, 3 Drawing Sheets

METHOD FOR MANUFACTURING A COPPER FUSE STRUCTURE

This application is a Divisional of application Ser. No. 10/197,861 filed Jul. 19, 2002 now U.S. Pat. No. 6,667,534.

BACKGROUND OF THE INVENTION

1. Field of the Invention

This present invention relates to the fabrication of integrated circuits. More particularly, this present invention relates to a copper fuse structure in a semiconductor and the manufacture method of the same.

2. Description of the Prior Art

Advances in semiconductor processing technologies, such as high-resolution photolithography and anisotropic plasma etching, are dramatically reducing the feature sizes of semiconductor devices and increasing the device packing density. Unfortunately, as the density of the semiconductor devices increases and the number of discrete devices increases on the chip, the final product yield for many integrated circuit devices (chip yield) can be decreased. For example, one circuit device that experiences this increase in yield loss with the increased circuit elements is the dynamic random access memory (DRAM) currently having 64 megabits of memory on a chip.

One method of overcoming this lower yield on RAM devices is to provide additional rows of memory cells and fusing each row of cells. Currently lasers are used to open the connections (fuses) in the multimegabit RAMs, such as in DRAM or SRAM devices, to disable defective rows of memory cells and to modify the address decoder so that spare rows of memory cells are selected instead.

A structure of a fuse in a semiconductor according to the prior art is shown as FIG. 1. A first inter-metal dielectric layer (IMD layer) 20 is deposited onto a substrate 10. After forming a plurality of openings in the fist IMD layer 20, the first metal plugs 22 and 22a are filled into the openings, as shown in FIG. 1. A secondary IMD layer 24 is deposited onto the first IMD layer 20 and the first metal plugs 22 and 22a. A plurality of holes is formed in the secondary IMD layer 24, wherein each of the holes is formed on each of the first metal plugs, and the first metal layers 26 and 26a are respectively filled into the holes. After repeating the above-mentioned steps, the third IMD layer 28, the secondary metal plugs 30 and 30a, the fourth IMD layer 32, and the secondary metal layers 34 and 34a are formed thereon. Finally, a passivation 36 is deposited onto the fourth IMD layer 32 and the secondary metal layers 34 and 34a, and the passivation 36 is damaged due to an etching process.

In order to couple the secondary metal layer 34 to an external conductive layer, the secondary metal layer 34 has to be exposed after the etching process. On the other hand, the secondary metal layer 34a is the fuse in the above-mentioned semiconductor. Therefore, after the etching process, a thin passivation still has to be retained on the secondary metal layer 34a. For the above-noted object, a well-known method in the prior art is utilizing a first mask for etching the passivation 36 on the secondary metal layer 34 to expose the secondary metal layer 34. The passivation 36 on the secondary metal layer 34a is not removed during the etching process with the first mask. Subsequently, a secondary mask is employed to remove the passivation 36 on the secondary metal layer 34a and keep a thin passivation on the second metal layer 34a.

In the prior art, the first metal plugs and the first metal layers are consisted of metallic copper, and the secondary metal plugs and the secondary metal layers are made of metallic aluminum. Generally, metallic copper is not preferred to be the composition of the fuse. The reason is that copper is a good material of heat exchange and the uppermost copper layer is usually thick. Consequently, higher energy is necessary during employing a laser repair tool to zip the copper fuse. Because the melting point of aluminum is lower than the melting point of copper, one method for resolving the problem of zipping the copper fuse is replacing the copper fuse with the aluminum fuse. So high energy is not necessary to zip an aluminum fuse. However, the cost of an aluminum fuse is higher than a copper fuse.

Hence, for improving the efficiency in manufacturing the semiconductor and saving the cost of the semiconductor, this present invention provides a copper fuse structure and the method for manufacturing the same.

SUMMARY OF THE INVENTION

In accordance with the present invention, a method is provided for fabricating a thin copper metal layer as a fuse in a semiconductor structure so that the copper fuse according to this present invention can be easily zipped by a laser repair tool.

It is another object of this invention to lower the cost of semiconductor manufacturing by utilizing a thin copper metal layer to displace the aluminum fuse in the semiconductor structure according to the prior art.

It is still another object of this present invention to combine the processes for forming an opening on a bonding pad and forming an opening on a fuse of the semiconductor structure. That is, the openings on the bonding pad and the fuse can be formed respectively by an etching process according to this prevent invention. Consequently, the method according to this prevent invention can facilitate the semiconductor manufacture.

In accordance with the above-mentioned objects, the invention provides a structure and fabricating method for a copper fuse in a semiconductor structure. According to this prevent invention, a copper metal layer disposed in an inner layer of a semiconductor structure is employed to be a copper fuse of a semiconductor device. Moreover, an opening on the fuse and an opening on the bonding pad can be formed in the same process, wherein the bonding pad is applied to connect the semiconductor structure and environment. Therefore, it is notably that a copper fuse can be formed effectively and economically in a semiconductor structure according to this present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1:
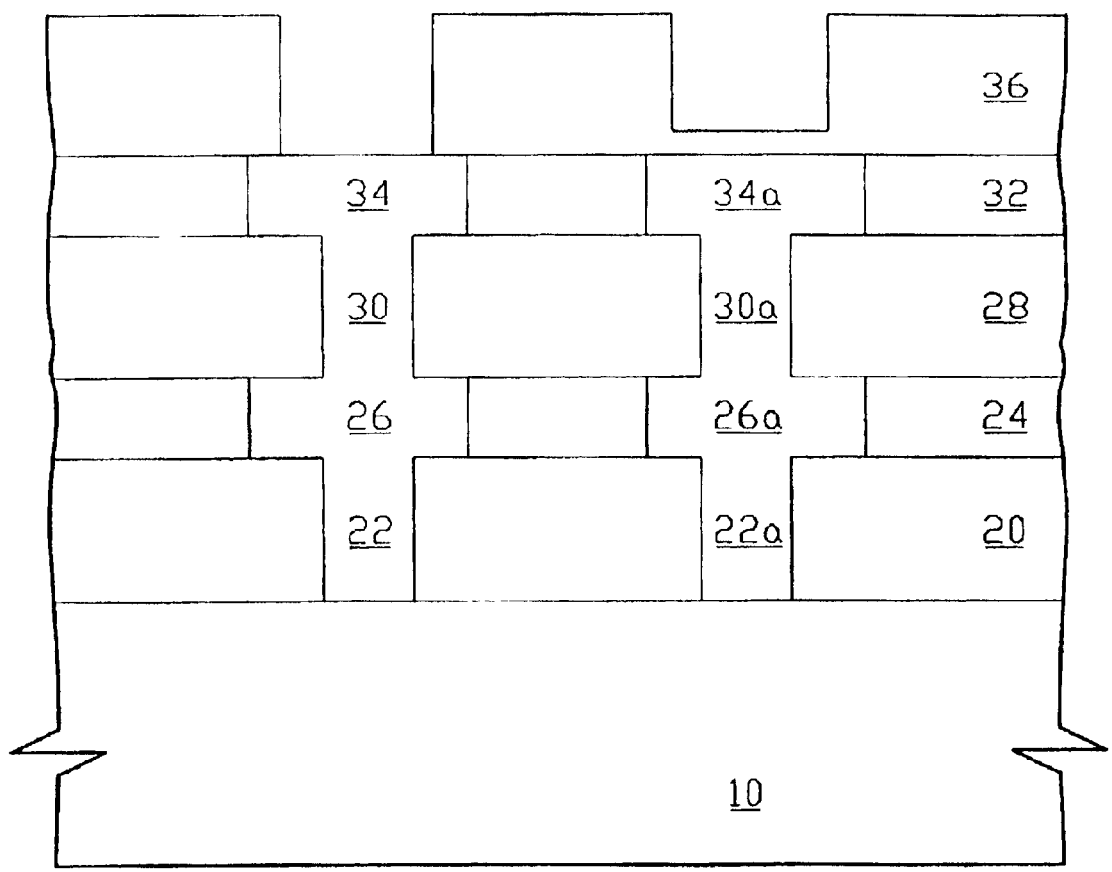
FIG. 1 is a diagram showing a semiconductor structure comprising a metal fuse according to the prior art.

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Then, the components of the semiconductor devices are not shown to scale. Some dimensions are exaggerated to the related components to provide a more clear description and comprehension of the present invention.

One preferred embodiment of this invention is a semiconductor structure comprising a copper fuse. A semiconductor structure according in this embodiment comprises a substrate, and a first metal layer and a copper fuse are formed on the substrate. The first metal layer and the copper fuse are disposed in the same layer and apart each other. An etching-stop layer is formed onto the copper fuse, wherein the etching-stop layer is a component of a first silicon nitride layer/or a component of a silicon oxide layer and a first silicon nitride layer. A dielectric layer is fabricated onto the first metal layer, wherein the dielectric layer may be a low K inter-metal dielectric layer. The dielectric layer comprises a metal connecting layer, wherein the metal connecting layer is electrically coupled with the first metal layer. A second metal layer is formed onto the dielectric layer, and the second metal layer is electrically coupled with the first metal layer through the metal connecting layer. A passivation is formed onto the second metal layer, and the first silicon nitride layer, wherein the passivation may be composed of a silicon oxide passivation and a silicon nitride passivation. The passivation comprises a first opening and a second opening, wherein the first opening is utilized to expose the secondary metal layer as a bonding pad of the semiconductor structure, and the secondary opening can expose the silicon oxide layer/the first silicon nitride layer. Moreover, the semiconductor structure comprises a secondary silicon nitride layer formed onto the sidewall of the first opening and the secondary opening. The secondary silicon nitride layer is employed to prevent the diffusion of a small molecule, such as water, copper atom, and so on, into the dielectric layer of the semiconductor structure according to this present invention.

Another preferred embodiment of this present invention is a method for fabricating a semiconductor comprising copper fuse. The following process can produce a structure according to this invention, referred to FIG. 2. After providing a substrate 100, a first inter-metal dielectric layer 110 is deposited onto the substrate 100, and a plurality of first holes are formed in the first inner metal dielectric layer 110. Copper metal is filled into the first holes, and a common process, such as a chemical mechanical polishing (CMP), is utilized to remove the unwanted copper metal. Subsequently, a secondary inner metal dielectric layer is deposited onto the first inner metal dielectric layer 110, and secondary holes are formed on the first holes respectively by an etching process. The secondary holes are filled by copper metal. The unwanted copper metal on the secondary inner metal dielectric layer is removed by a process such as chemical mechanical polishing to form the first metal layers 130 and 130a, wherein the first metal layer 130 is a metal inner connection of the semiconductor structure, and the first metal layer 130a is the copper fuse of this embodiment.

One character of this present invention is forming an etching-stop layer on the fuse of the semiconductor. In order to retain at least a silicon oxide layer on the fuse after the etching process hereinafter for a passivation of the semiconductor, a silicon oxide layer 140 and a silicon nitride layer 150 are deposited onto the secondary inner metal dielectric layer and the first metal layer. An unwanted result that the bonding pad and the fuse of the semiconductor structure will be exposed after the etching process of the passivation of the semiconductor can be avoided by the silicon oxide layer 140 and the silicon nitride layer 150, wherein the result will cause some problems on the circuit of the semiconductor.

Figure 2:
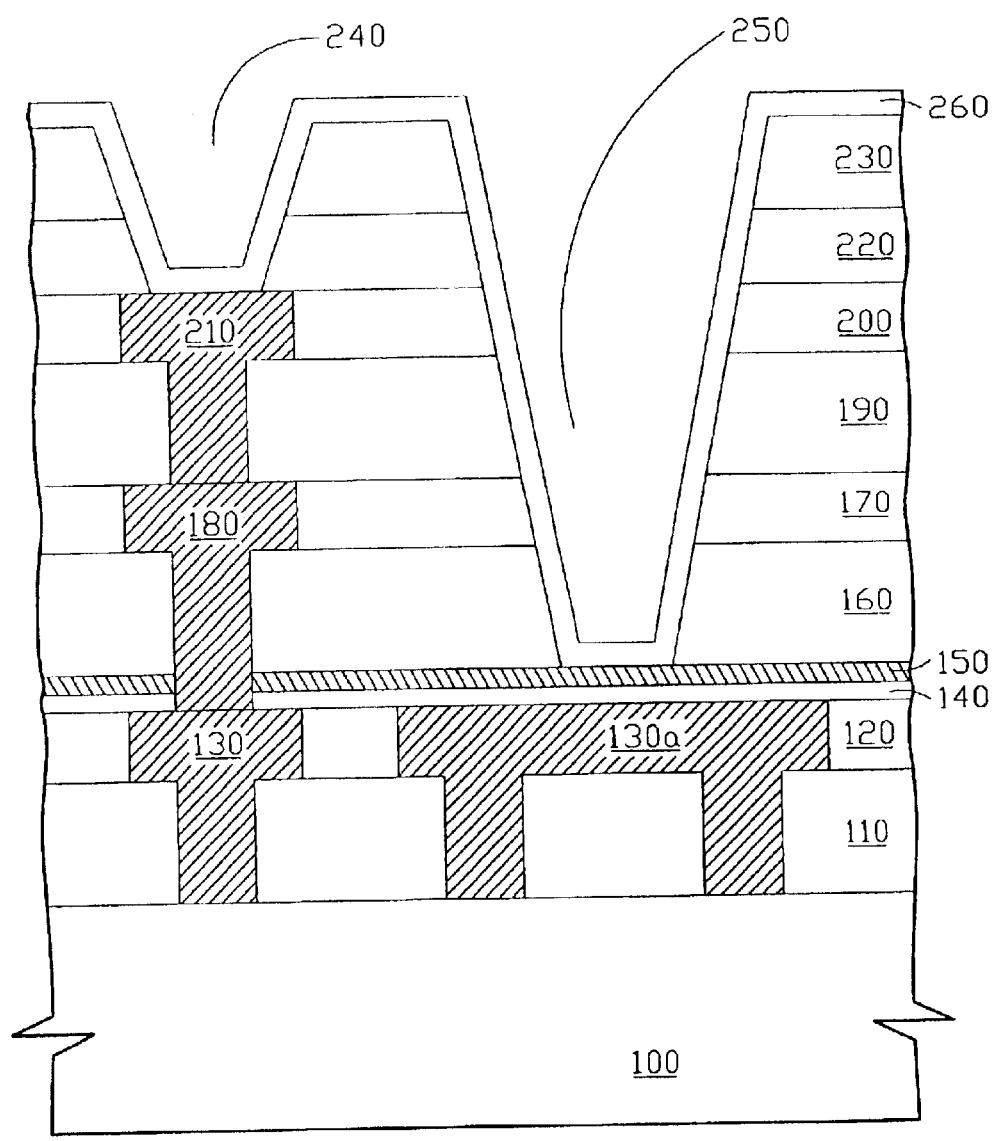
FIG. 2 is an illustration of a semiconductor structure comprising a metal fuse according to this presented invention.

After forming the etching-stop layer, a third inner metal dielectric layer 160 is deposited onto the etching-stop layer. A third hole is formed on the first metal layer 130 by etching the third inner metal dielectric layer 160, the silicon nitride 150 and the silicon oxide layer 140. The third hole is filled with copper metal and the wasted copped metal on the third inner metal dielectric layer is removed. A fourth inner metal dielectric layer 170 is deposited onto the third inner metal dielectric layer 160, and a fourth hole is formed in the fourth inner metal dielectric layer 170 on the third hole filled with copper metal. The fourth hole is filled with copper metal, and the wasted copper metal on the fourth inner metal dielectric layer is removed, so that a second metal layer 180 is formed. The steps above-mentioned are repeated to obtain a fifth inner metal dielectric layer 190 formed onto the fourth inner metal dielectric layer 170 and the secondary metal layer 180, a sixth inner metal dielectric layer 200 formed onto the fifth inner metal dielectric layer 190, and a third metal layer 210 in the fifth inner metal dielectric layer 190 and the sixth inner metal dielectric layer 200, as shown in FIG. 2. The third metal layer 210 is utilized as a bonding pad for connecting the semiconductor and the environment.

A silicon oxide passivation 220 is deposited onto the sixth inner metal dielectric layer 200 and the third metal layer 210, and a silicon nitride passivation 230 is deposited onto the silicon oxide passivation 220. Another characteristic of this present invention is described as following. After an etching process, an opening is formed on the bonding pad and another opening is formed on the etching-stop layer on the fuse. That is, in the etching process, the silicon nitride passivation 230 and the silicon oxide passivation 220 on the third metal layer 210 are removed to form an opening 240 to expose the third metal layer 210, and the silicon nitride passivation 230, the silicon oxide passivation 220, the sixth inner metal dielectric layer 200, the fifth inner metal dielectric layer 190, the fourth inner metal dielectric layer 170 and the third inner metal dielectric layer 160 over the first metal layer 130a is removed to form an opening 250 on the etching-stop layer on the first metal layer 130a. Sequentially, a silicon nitride layer 260 is deposited onto the silicon nitride passivation 230, the opening 240 and the opening 250. Finally, an isotropic etching process is performed to the silicon nitride layer 260. After etching the silicon nitride layer 260, the third metal layer 210, employed as the bonding pad of the semiconductor, is exposed. On the other hand, after the etching process, the silicon oxide layer 140 and/or the silicon nitride layer 150 on the first metal layer 130a, employed as the fuse of the semiconductor, is exposed.

In the above-mentioned embodiment, the silicon nitride layer 260 is employed to prevent moisture or copper diffusing into the exposed inner metal dielectric layer during the manufacture, especially into the low K inner metal dielectric layer. The silicon oxide layer 140 and the silicon nitride layer 150 is utilized to prevent the expose of the first metal layer 130a during the etching process, so that many problems on circuit of the semiconductor can be avoided.

Figure 3:
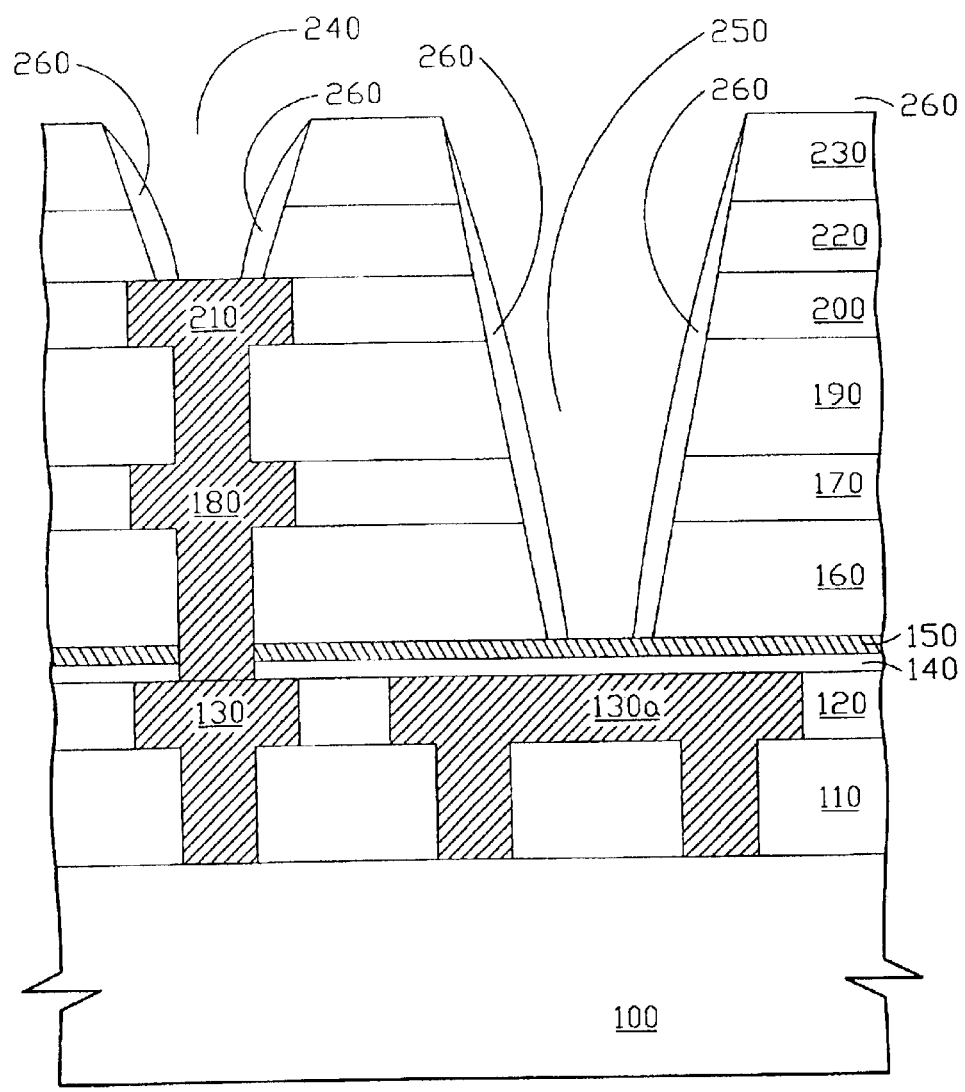
FIG. 3 is a diagram of the semiconductor structure in FIG. 2, after the step for etching the silicon nitride 260.

By the above-mentioned method, after the etching process of the silicon nitride layer 260, the bonding pad of the semiconductor will be exposed, and the fuse of the semiconductor will not be exposed. The silicon oxide layer 140 and the silicon nitride layer 150 on the fuse are very important in the etching process of the silicon nitride 260. After the above-mentioned etching process of the silicon nitride 260, the etching process is stopped over the fuse 130a for not exposing the fuse layer. As the method for stopping the etching process at the silicon oxide layer 140/or the silicon nitride layer 150, the parameters in the etching process is controlled and the thickness of the silicon nitride 260, silicon oxide 140 and the silicon nitride 150 is adjusted. For example, the thickness of the silicon nitride 260 may be 2000±500 Å, and the thickness of the silicon oxide 140 and silicon nitride 150 are 1500±500 Å, respectively. By this, just the silicon nitride 260, even the silicon nitride 150, will be removed in the etching process of the silicon nitride 260, as shown in FIG. 3. The silicon oxide 140 at least is retained on the fuse 130a, and thus the fuse 130a will not be exposed after the above-mentioned etching process.

When a defect exists in a circuit cell applied to the semiconductor structure according to this invention, a laser repair tool is employed to zip the first metal layer 130a as a fuse in the semiconductor structure, and an auxiliary circuit cell (not shown in the Figures) is utilized to replace the above-cited circuit cell. In contrast of the copper fuse in the prior art, wherein the copper fuse is made of an upper copper layer and the upper copper layer is at the same layer of the bonding pad, the copper fuse according to this invention consists of an inner copper layer. The advantage of the construction according to this present invention is the inner copper layer is thinner than the upper copper layer. Therefore, it is easier for utilizing the laser repair tool to zip the copper fuse according to this invention.

According to the preferred embodiment, this invention discloses a method to form a copper fuse in a semiconductor structure. In this present invention, a thin inner copper layer is utilized to be a fuse in a semiconductor structure, i.e., this invention provides material for the fuse in a semiconductor structure, wherein the material is low cost and easy to be zipped by a laser repair tool. Moreover, in this invention, an opening is formed on the fuse of the semiconductor while forming an opening on a bonding pad of the semiconductor. In other words, the openings on the fuse and the bonding pad can be formed respectively by an etching process according to this present invention. Thus, the method of this present invention can improve the application of a copper fuse and the efficiency of fuse manufacture.

Although specific embodiments have been illustrated and described, it will be obvious to those skilled in the art that various modifications may be made without departing from what is intended to be limited solely by the appended claims.

What is claimed is:

1. A method for fabricating a copper fuse, wherein the copper fuse is in a semiconductor, comprising:

providing a substrate;

forming a first metal layer onto said substrate;

forming a copper fuse onto said substrate, wherein said first metal layer and said copper fuse are disposed at the same layer and are separated from each other;

forming an etching stop layer onto said copper fuse;

forming a dielectric layer onto said first metal layer;

forming a metal connective layer into said dielectric layer, wherein said metal connective layer is electrically coupling with said first metal layer;

forming a secondary metal layer onto said dielectric layer, wherein said secondary metal layer is electrically coupling with said metal connective layer;

forming a protective layer onto said secondary metal layer, and said etching-stop layer; and etching said protective layer to form a first opening and a secondary opening, wherein said secondary metal layer is exposed by said first opening and said etching-stop layer is exposed by said secondary opening.

2. The method according to claim 1, wherein said step for forming the etching-stop layer comprises:

forming a silicon oxide layer onto said copper fuse; and forming a silicon oxide layer onto said silicon nitride layer.

3. A method for fabricating a copper fuse, wherein the copper fuse is in a semiconductor, comprising:

providing a substrate;

forming a first metal layer onto said substrate;

forming a copper fuse onto said substrate, wherein said first metal layer and said copper fuse are disposed at the same layer and separated each other;

forming a etching stop layer onto said copper fuse;

forming a dielectric layer onto said first metal layer;

forming a metal connective layer into said dielectric layer, wherein said metal connective layer is electrically coupling with said first metal layer;

forming a secondary metal layer onto said dielectric layer, wherein said secondary metal layer is electrically coupling with said metal connective layer;

forming a protective layer onto said secondary metal layer, and said etching-stop layer;

etching said protective layer to form a first opening and a secondary opening, wherein said secondary metal layer is exposed by said first opening and said etching-stop layer is exposed by said secondary opening; and forming a silicon nitride layer at a side wall of said first opening and said secondary opening.

4. The method according to claim 1, wherein said step for forming said etching-stop layer is fabricating a silicon nitride layer onto said copper fuse.

5. The method according to claim 1, wherein said first metal layer comprises copper.

6. The method according to claim 1, wherein said secondary metal layer comprises copper.

7. The method according to claim 1, wherein said first metal layer is a metal interconnect layer.

8. The method according to claim 1, wherein said secondary metal layer is a metal interconnect layer.

* * * * *